United States Patent
Kim et al.

(10) Patent No.: US 8,238,148 B2
(45) Date of Patent: Aug. 7, 2012

(54) SEMICONDUCTOR DEVICE HAVING ARCHITECTURE FOR REDUCING AREA AND SEMICONDUCTOR SYSTEM INCLUDING THE SAME

(75) Inventors: Ho Jung Kim, Suwon-si (KR); Chul Woo Park, Yongin-si (KR); Sang Beom Kang, Hwasung-si (KR); Jung Min Lee, Suwon-si (KR); Hyun Ho Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 244 days.

(21) Appl. No.: 12/652,190

(22) Filed: Jan. 5, 2010

(65) Prior Publication Data

US 2010/0172174 A1 Jul. 8, 2010

(30) Foreign Application Priority Data

Jan. 5, 2009 (KR) .................. 10-2009-0000452

(51) Int. Cl.
*G11C 11/00* (2006.01)
*G11C 7/10* (2006.01)
*G11C 7/00* (2006.01)
*G11C 8/00* (2006.01)

(52) U.S. Cl. ............ 365/163; 365/189.05; 365/189.2; 365/239; 365/148

(58) Field of Classification Search .......... 365/163, 365/189.05, 189.2, 148, 239
See application file for complete search history.

(56) References Cited

U.S. PATENT DOCUMENTS

| 6,373,777 | B1 * | 4/2002 | Suzuki | 365/230.03 |
| 7,852,659 | B2 * | 12/2010 | Kang et al. | 365/148 |
| 2008/0151656 | A1 * | 6/2008 | Nakai | 365/189.16 |

FOREIGN PATENT DOCUMENTS

| KR | 10-2001-0001292 A | 1/2001 |
| KR | 10-2005-0077940 A | 8/2005 |
| KR | 10-2008-0040248 A | 5/2008 |

* cited by examiner

*Primary Examiner* — Hoai V Ho
*Assistant Examiner* — Tri Hoang
(74) *Attorney, Agent, or Firm* — Sughrue Mion, PLLC (57) ABSTRACT

A semiconductor device having an architecture for reducing an area is provided. The semiconductor device includes a memory cell array including a plurality of non-volatile memory cells, a plurality of registers each configured to store pre-fetch unit data, and a write driver circuit configured to write pre-fetch unit data sequentially output from the plurality of registers to the memory cell array during a write operation. The semiconductor device also includes a sense amplifier circuit configured to sense and amplify pre-fetch unit data sequentially output from the memory cell array and to sequentially store the amplified pre-fetch unit data in the plurality of registers, respectively, during a read operation.

20 Claims, 10 Drawing Sheets

SEMICONDUCTOR DEVICE HAVING ARCHITECTURE FOR REDUCING AREA AND SEMICONDUCTOR SYSTEM INCLUDING THE SAME

CROSS-REFERENCE TO RELATED APPLICATIONS

This application claims priority from Korean Patent Application No. 10-2009-0000452, filed on Jan. 5, 2009, in the Korean Intellectual Property Office, the disclosure of which is incorporated herein in its entirety by reference.

BACKGROUND

1. Field

Apparatuses consistent with the inventive concept relate to a semiconductor device, and more particularly, to a semiconductor device for reducing an area occupied by a sense amplifier and write driver block by decreasing the number of sense amplifiers and the number of write drivers, and a semiconductor system including the same.

2. Description of Related Art

Resistive memory devices process (e.g., write or read) a large amount of data, e.g., 512 bytes to 4 Kbytes, at one time and thus need quite a few sense amplifiers and write drivers. Consequently, the sense amplifiers and the write drivers occupy a large area in resistive memory devices.

SUMMARY

One or more exemplary embodiments provide a semiconductor device for reducing an area occupied by a sense amplifier and write driver block by decreasing the number of sense amplifiers and the number of write drivers, and a semiconductor system including the same.

According to an exemplary embodiment, there is provided a semiconductor device including a memory cell array including a plurality of non-volatile memory cells, a plurality of registers each configured to store pre-fetch unit data, and a write driver circuit configured to write pre-fetch unit data sequentially output from the plurality of registers to the memory cell array during a write operation.

The semiconductor device may further include a sense amplifier circuit configured to sense and amplify pre-fetch unit data sequentially output from the memory cell array and to sequentially store the amplified pre-fetch unit data in the plurality of registers, respectively, during a read operation. The non-volatile memory cells may include resistive memory cells or phase-change memory cells.

According to an exemplary embodiment, there is provided a semiconductor device including a memory cell array including a plurality of non-volatile memory cells, a register configured to store write data or read data, a write driver circuit configured to sequentially read the write data in pre-fetch units from the register and sequentially write the write data to the memory cell array during a write operation, and a sense amplifier circuit configured to sequentially sense and amplify the read data in pre-fetch units from the memory cell array and to store the amplified read data in the register during a read operation.

According to an exemplary embodiment, there is provided a semiconductor system including a semiconductor device and a processor configured to control an operation of the semiconductor device. The semiconductor device includes a memory cell array including a plurality of non-volatile memory cells, a plurality of registers each configured to store pre-fetch unit data, and a write driver circuit configured to write pre-fetch unit data sequentially output from the plurality of registers to the memory cell array during a write operation.

The semiconductor device may further include a sense amplifier circuit configured to sense and amplify pre-fetch unit data sequentially output from the memory cell array and to sequentially store the amplified pre-fetch unit data in the plurality of registers, respectively, during a read operation.

According to an exemplary embodiment, there is provided a semiconductor system including a semiconductor device and a processor configured to control an operation of the semiconductor device. The semiconductor device includes a memory cell array comprising a plurality of non-volatile memory cells, a register configured to store write data or read data, a write driver circuit configured to sequentially read the write data in pre-fetch units from the register and sequentially write the write data to the memory cell array during a write operation, and a sense amplifier circuit configured to sequentially sense and amplify the read data in pre-fetch units from the memory cell array and to store the amplified read data in the register during a read operation.

BRIEF DESCRIPTION OF THE DRAWINGS

The above and other aspects will become more apparent by describing in detail exemplary embodiments thereof with reference to the attached drawings in which.

DETAILED DESCRIPTION OF THE EXEMPLARY EMBODIMENTS

Exemplary embodiments now will be described more fully hereinafter with reference to the accompanying drawings. The exemplary embodiments may, however, be embodied in many different forms and should not be construed as limiting the scope of the claims. Rather, these exemplary embodiments are provided so that this disclosure will be thorough and complete, and will convey a complete understanding to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular exemplary embodiments only and is not intended to be limiting. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the exemplary embodiments belong. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
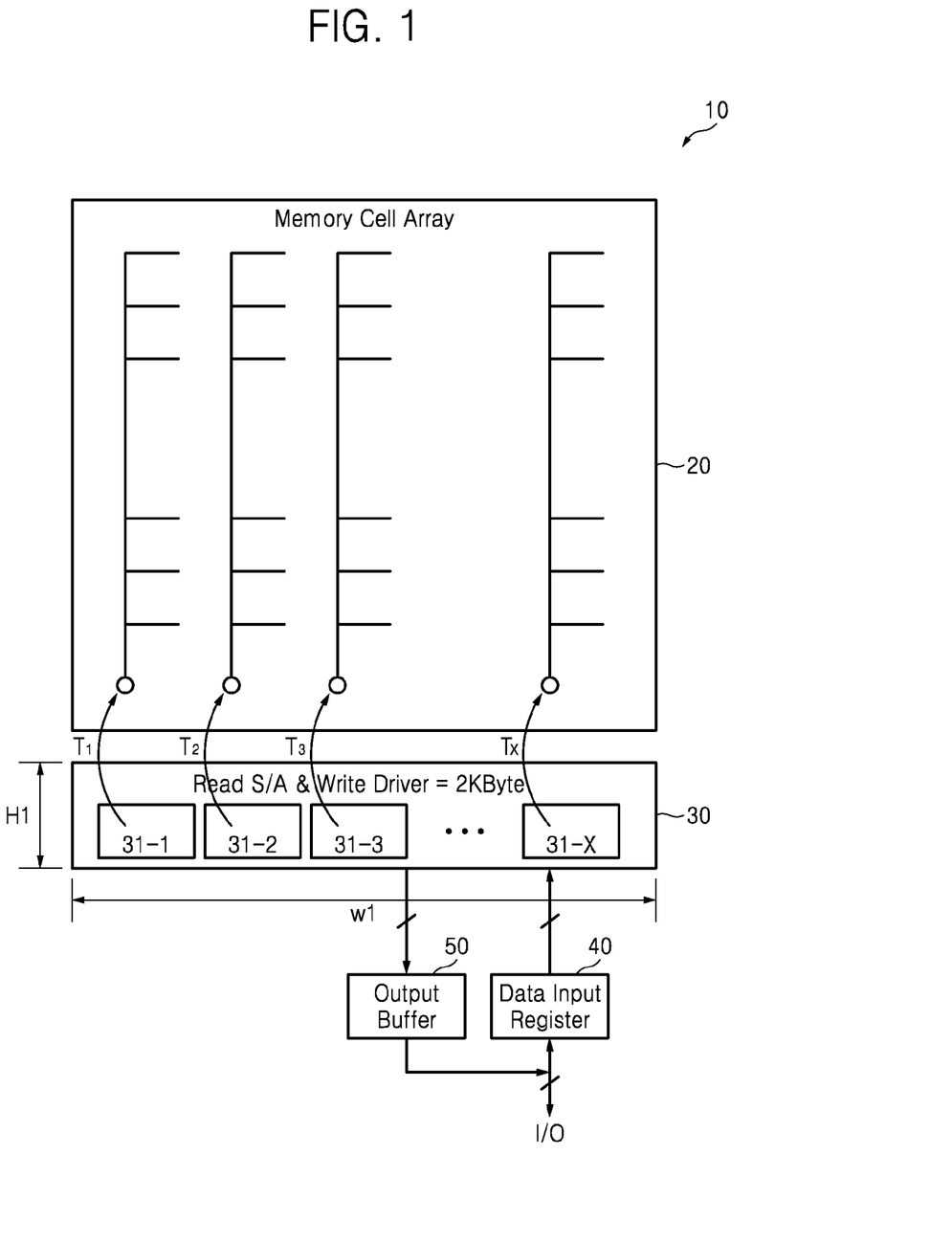
FIG. 1 is a schematic block diagram of a semiconductor device including a related art sense amplifier and write driver block.

FIG. 1 is a schematic block diagram of a semiconductor device 10 including a related art sense amplifier and write driver block 30. The semiconductor device 10 includes a memory cell array 20, the sense amplifier (S/A) and write driver block 30, a data input register 40, and an output buffer 50. The memory cell array 20 includes a plurality of memory cells for storing data. Each of the memory cells is connected with one of a plurality of wordlines and one of a plurality of bitlines and is selected by an output signal of a row decoder (not shown) decoding a row address and an output signal of a column decoder (not shown) decoding a column address.

The S/A and write driver block 30 includes a plurality of processing blocks 31-1 through 31-X (where X is a natural number). Each of the processing blocks 31-1 through 31-X may include a sense amplifier, a write driver, and a register. The S/A and write driver block 30 needs $2^{14}$ processing blocks to process 2 Kbytes at one time. In particular, the layout area of a single S/A is large, and therefore, the layout area of the S/A and write driver block 30 including $2^{14}$ S/As and $2^{14}$ write drivers is quite large. A single S/A may be implemented by about 50 transistors.

During a write operation, the data input register 40 receives and stores external write data through input/output (I/O) data lines and transmits the stored write data to the S/A and write driver block 30. During a read operation, the output buffer 50 receives and buffers read data output from the S/A and write driver block 30 and outputs the buffered read data to an external device through I/O data lines.

During the write operation, the write drivers of the S/A and write driver block 30 write the write data received from the data input register 40 to the memory cell array 20. During the read operation, the S/As of the S/A and write driver block 30 sense and amplify the read data output from the memory cell array 20 and output the amplified read data to the output buffer 50. As described above, the layout area of the S/A and write driver block 30 having an architecture shown in FIG. 1 is very large. One or more exemplary embodiments provide a S/A and write driver block having an architecture for decreasing the layout area.

Figure 2:
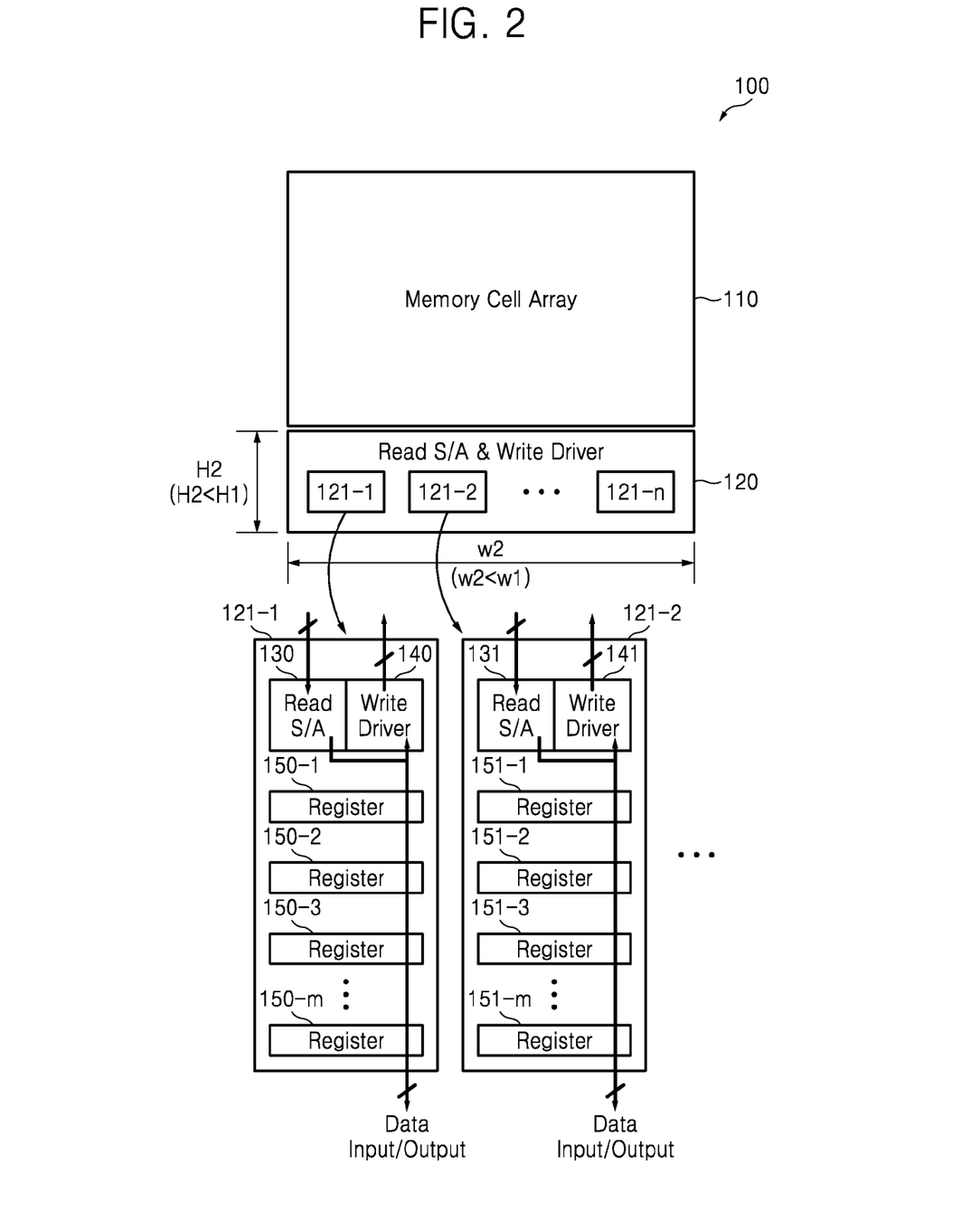
FIG. 2 is a schematic block diagram of a semiconductor device including a sense amplifier (S/A) and write driver block according to an exemplary embodiment.

FIG. 2 is a schematic block diagram of a semiconductor device 100 including a S/A and write driver block 120 according to some embodiments of the present invention. The semiconductor device 100 includes a memory cell array 110 and the S/A and write driver block 120. The memory cell array 110 includes a plurality of non-volatile memory cells, which may be implemented by resistive memory cells, phase-change memory cells, or flash electrically erasable programmable read-only memory (EEPROM) cells. The memory cell array 110 also includes a plurality of wordlines, a plurality of bitlines.

The S/A and write driver block 120 includes one or more processing blocks 121-1 through 121-$n$, each of which includes a S/A circuit 130, a write driver circuit 140, and a plurality of registers 150-1 through 150-$m$, where "n" and "m" are natural numbers and n=m or n≠m. For clarity of the description, it is assumed that the capacity of the S/A and write driver block 120 is 2 Kbytes, each of the processing blocks 121-1 through 121-$n$ processes 16 bytes (hereinafter, referred to as a "pre-fetch unit") of data at a time, and each of the registers 150-1 through 150-$m$ processes pre-fetch units of data at a time.

The registers 150-1 through 150-$m$ share the S/A circuit 130 and the write driver circuit 140 with one another. The number of the processing blocks 121-1 through 121-$n$ included in the S/A and write driver block 120 is much less than the number of processing blocks 31-1 through 31-$x$ included in the S/A and write driver block 30 illustrated in FIG. 1. For instance, in order to process 2 Kbytes at one time using the processing blocks 121-1 through 121-$n$ each processing 16 bytes at a time, 128 processing blocks 121-1 through 121-$n$ are needed. At this time, the S/A and write driver block 120 needs $2^7$ S/As and $2^7$ write drivers. However, the S/A and write driver block 30 illustrated in FIG. 1 needs $2^{14}$ S/As and $2^{14}$ write drivers. When the number of registers increases, the number of processing blocks decreases. For instance, the S/A and write driver block 120 may be implemented by a single processing block and 128 registers. At this time, the S/A and write driver block 120 has a width w2 and a height H2 which are less than a width w1 and a height H1 of the S/A and write driver block 30.

Figure 3:
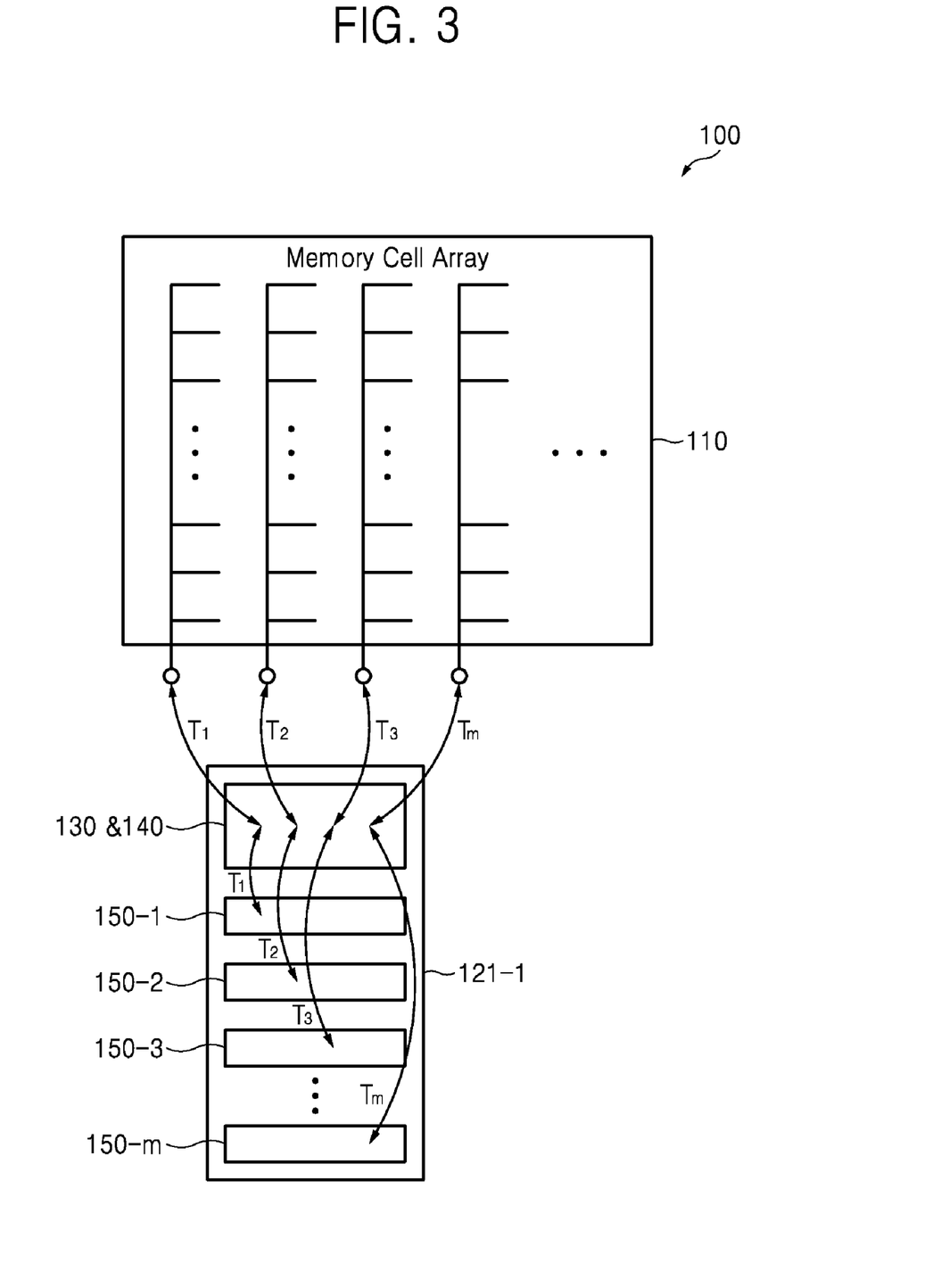
FIG. 3 is a conceptual diagram for explaining a data write operation and a data read operation of the semiconductor device illustrated in FIG. 2 using a time division method.

FIG. 3 is a conceptual diagram for explaining a data write operation and a data read operation of the semiconductor device 100 illustrated in FIG. 2 using a time division method. Referring to FIGS. 2 and 3, during the write operation, the first processing block 121-1 is controlled by a memory controller (which is a general name of a device for controlling the write and read operations of the semiconductor device 100) to store write data (e.g., 2-Kbyte data) output from the memory controller in pre-fetch (e.g., of 16 bytes) units in the registers 150-1 through 150-$m$ sequentially (in the time division method).

The write driver circuit 140, which can process data in pre-fetch units, writes pre-fetch unit data output from each of the registers 150-1 through 150-*m* sequentially (or in the time division method) to the memory cell array 110. For instance, the write driver circuit 140 writes first write data output from the first register 150-1 to a first region of the memory cell array 110 at a time $T_1$ and writes second write data output from the second register 150-2 to a second region of the memory cell array 110 at a time $T_2$ ($T_1 < T_2$). In the same manner, the write driver circuit 140 sequentially writes data output from the registers 150-3 through 150-*m* to corresponding regions, respectively, of the memory cell array 110 at times $T_3$ through $T_m$, respectively. Each of the registers 150-1 through 150-*m* may be replaced with a memory device that processes data in pre-fetch units using a first-in, first-out (FIFO) method. Alternatively, each of the registers 150-1 through 150-*m* may be replaced with cache memory.

During the read operation, the S/A circuit 130, which can process data in pre-fetch units, is controlled by the memory controller to sense and amplify read data stored in the memory cell array 110 in pre-fetch units sequentially (or in the time division method) and then write the read data in the registers 150-1 through 150-*m* sequentially (or in the time division method). For instance, the S/A circuit 130 senses and amplifies first read data of a pre-fetch unit output from the first region of the memory cell array 110 and stores the first read data in the first register 150-1 at the time $T_1$. Thereafter, the S/A circuit 130 senses and amplifies second read data of a pre-fetch unit output from the second region of the memory cell array 110 and stores the second read data in the second register 150-2 at the time $T_2$ ($T_1 < T_2$). In the same manner, the S/A circuit 130 senses and amplifies pre-fetch unit read data output from the regions of the memory cell array 110 and stores the amplified read data in the registers 150-3 through 150-*m*, respectively, at times $T_3$ through $T_m$, respectively. Here, $T_1 < T_2 < T_3 < \ldots < T_m$.

In addition the memory cell array 110 may include a plurality of memory cells arranged in a plurality of columns and rows. The write driver circuit 140 may communicate with the plurality columns and rows and write pre-fetch unit data sequentially to the plurality of columns and rows. For example, the write driver circuit 140 may write first write data output from the first register 150-1 to a first memory cell column of the plurality of columns of the memory cell array 110, and write second write data output from the second register 150-2 to a second memory cell column of the plurality of columns of the memory cell array 110.

Figure 4:
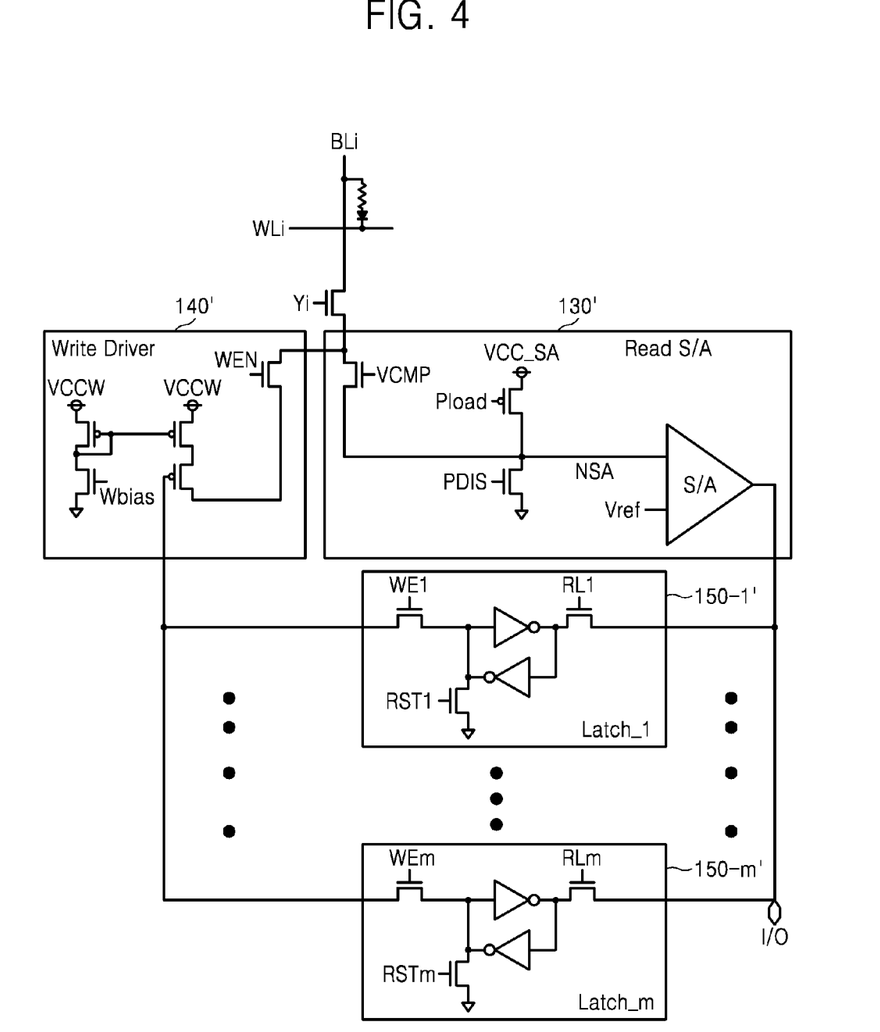
FIG. 4 is a circuit diagram of a portion of a processing block including a S/A, a write driver, and a plurality of unit registers according to an exemplary embodiment.

FIG. 4 is a circuit diagram of a portion of one of the processing blocks 121-1 through 121-*n* illustrated in FIG. 2 according to an exemplary embodiment. For clarity of the description, FIG. 4 illustrates a S/A circuit 130' and a write driver circuit 140', which are connected to a bitline BLi, and a plurality of latches 150-1' through 150-*m*' connected between the S/A circuit 130' and the write driver circuit 140'. The latches 150-1' through 150-*m*' are initialized in response to reset signals RST1 through RSTm, respectively.

During the write operation, a first latch 150-1' latches write data in response to a first write control signal RL1. The write driver circuit 140' transmits the write data output from the first latch 150-1' to the bitline BLi in response to a write enable signal WE1. In other words, the latches 150-1' through 150-*m*' latch write data in response to write control signals RL1 through RLm, respectively, which are sequentially activated. The write driver circuit 140' transmits the data sequentially output from the respective latches 150-1' through 150-*m*' to the bitline BLi in response to write enable signals WE1 through WEm. During the read operation, the S/A circuit 130' amplifies data sequentially transmitted from the bitline BLi based on a reference voltage Vref and sequentially transmits the data to the latches 150-1' through 150-*m*', respectively.

Figure 5:
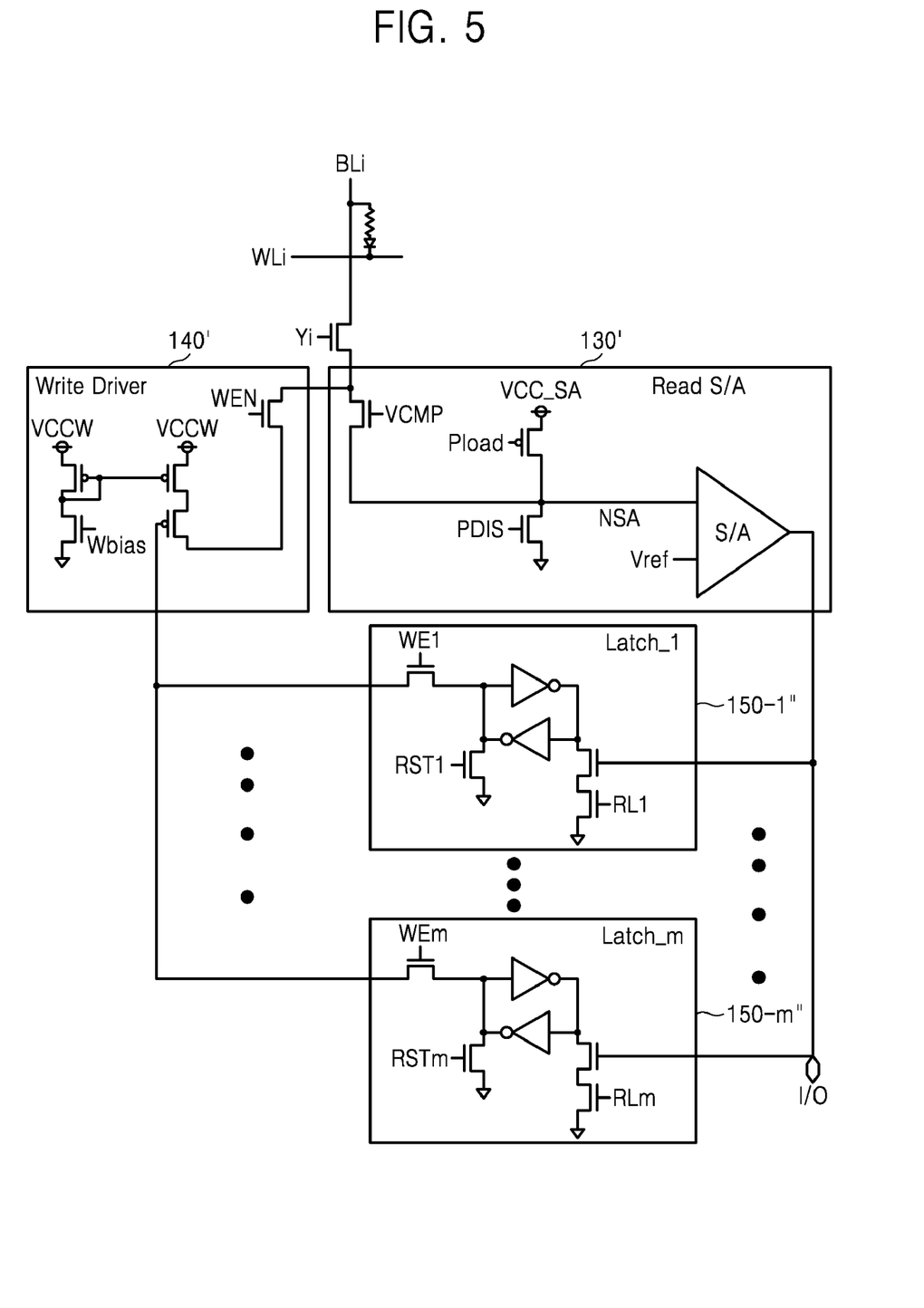
FIG. 5 is a circuit diagram of a portion of a processing block including a S/A, a write driver, and a plurality of unit registers according to an exemplary embodiment.

FIG. 5 is a circuit diagram of a portion of one of the processing blocks 121-1 through 121-*n* illustrated in FIG. 2 according to an exemplary embodiment. For clarity of the description, FIG. 5 illustrates the S/A circuit 130' and the write driver circuit 140', which are connected to the bitline BLi, and a plurality of latches 150-1" through 150-*m*" connected between the S/A circuit 130' and the write driver circuit 140'. The latches 150-1" through 150-*m*" are initialized in response to the reset signals RST1 through RSTm, respectively.

During the write operation, a first latch 150-1" latches write data in response to the first write control signal RL1. The write driver circuit 140' transmits the write data output from the first latch 150-1" to the bitline BLi in response to the write enable signal WE1. In other words, the latches 150-1" through 150-*m*" latch write data in response to the write control signals RL1 through RLm, respectively, which are sequentially activated. The write driver circuit 140' transmits the data sequentially output from the respective latches 150-1" through 150-*m*" to the bitline BLi in response to the write enable signals WE1 through WEm. During the read operation, the S/A circuit 130' amplifies data sequentially transmitted from the bitline BLi based on the reference voltage Vref and sequentially transmits the data to the latches 150-1" through 150-*m*", respectively.

Figure 6:
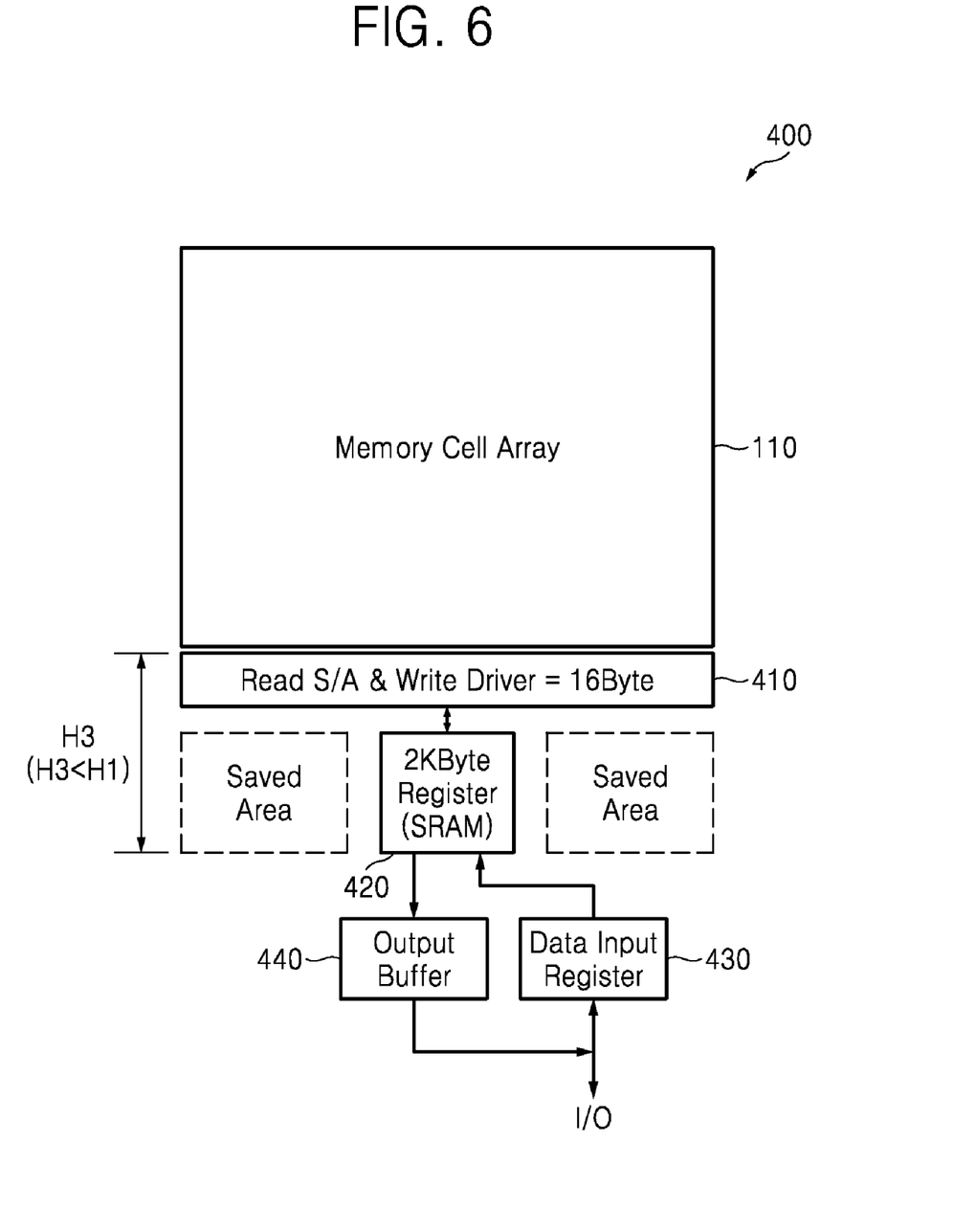
FIG. 6 is a schematic block diagram of a semiconductor device including a S/A circuit and a write driver circuit according to an exemplary embodiment.

FIG. 6 is a schematic block diagram of a semiconductor device 400 including a S/A circuit and a write driver according to an exemplary embodiment. Referring to FIG. 6, the semiconductor device 400 includes the memory cell array 110, a S/A and write driver block 410, a register 420, a data input register 430, an output buffer 440.

The S/A and write driver block 410 includes a write driver circuit and a S/A circuit for processing 16-byte data. The register 420 can store a page size data, e.g., 2-Kbyte data. During the write operation, 2-Kbyte write data is input through the data input register 430 and stored in the register 420. The write driver circuit of the S/A and write driver block 410 sequentially reads the write data in pre-fetch units from the register 420 and writes the write data to the memory cell array 110. The S/A and write driver block 410 may sequentially read the write data in pre-fetch units from the register 420 and write the write data to the memory cell array 110 while the write data is being stored in the register 420.

During the read operation, the S/A circuit of the S/A and write driver block 410 sequentially senses and amplifies read data in pre-fetch units from the memory cell array 110 and stores the amplified read data in the register 420. The S/A circuit of the S/A and write driver block 410 is controlled by a memory controller to output 2-Kbyte read data stored in the register 420 to an external device through the output buffer 440.

Referring to FIGS. 1 and 6, the S/A and write driver block 410 in FIG. 6 can be implemented much smaller than the S/A and write driver block 30 illustrated in FIG. 1. For instance, while the S/A and write driver block 30 illustrated in FIG. 1 includes $2^{14}$ S/As and $2^{14}$ write drivers, the S/A and write driver block 410 illustrated in FIG. 6 includes $2^7$ S/As and $2^7$ write drivers. In addition, S/A and write driver block 410 of FIG. 6 has a height H3 that is less than height H1 of S/A and write driver block 30 of FIG. 1.

Figure 7:
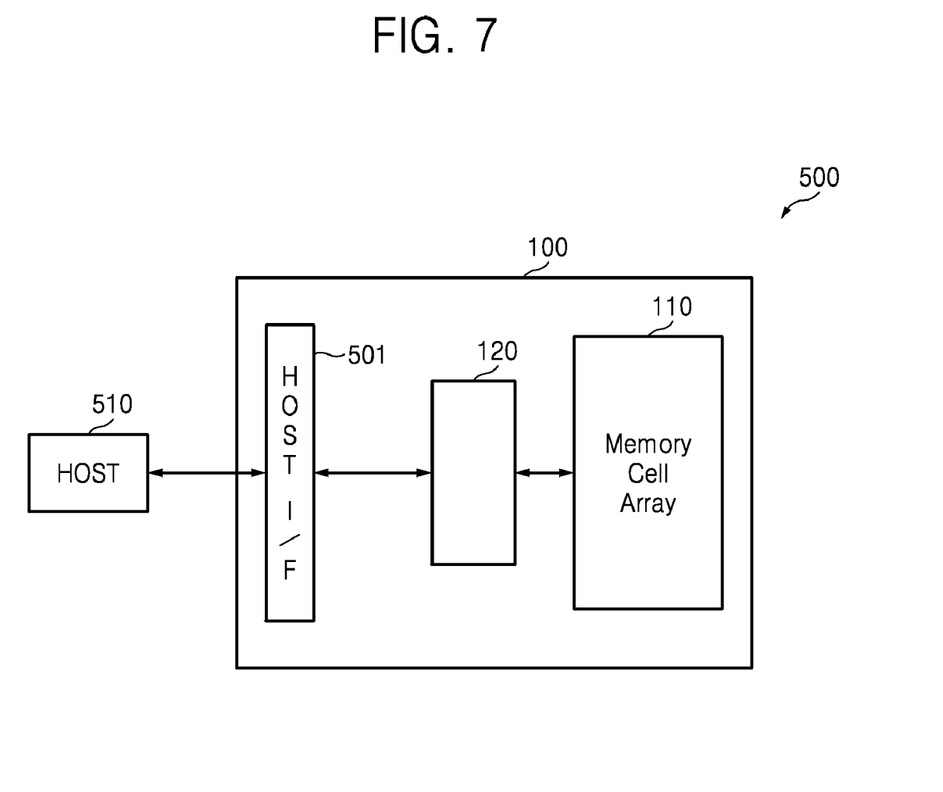
FIG. 7 is a schematic block diagram of a semiconductor system including the semiconductor device illustrated in FIG. 2.
Figure 9:
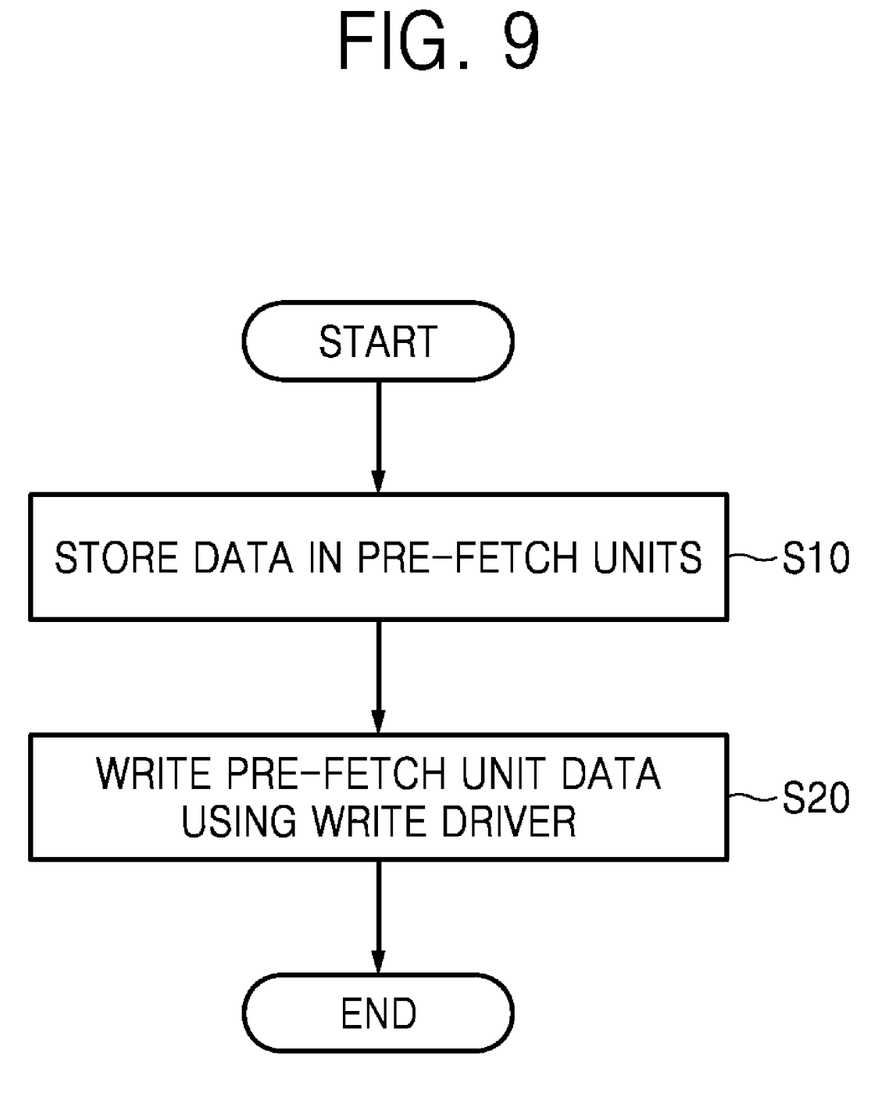
FIG. 9 is a flowchart of an operation of writing pre-fetch unit data according to an exemplary embodiment.
Figure 10:
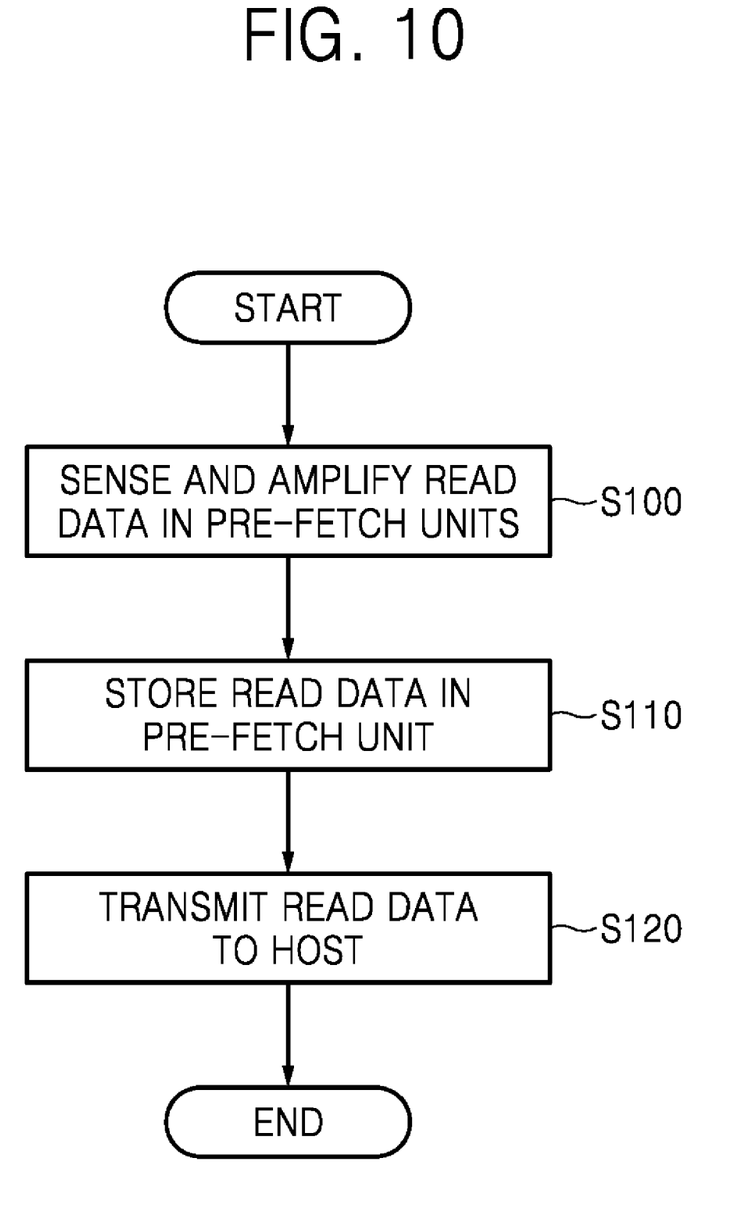
FIG. 10 is a flowchart of an operation of reading pre-fetch unit data according to an exemplary embodiment.

FIG. 7 is a schematic block diagram of a semiconductor system 500 including the semiconductor device 100 illustrated in FIG. 2. FIG. 9 is a flowchart of an operation of writing pre-fetch unit data according to an exemplary embodiment. FIG. 10 is a flowchart of an operation of reading pre-fetch unit data according to an exemplary embodiment. Referring to FIGS. 7, 9, and 10, the semiconductor system 500 includes the semiconductor device 100 and a processor, e.g., a host, 510 for controlling the operation of the semiconductor device 100.

Referring to FIGS. 2, 7 and 9, the semiconductor device 100 includes the memory cell array 110 including a plurality of non-volatile memory cells, the S/A and write driver block 120, and a host interface (I/F) 501. As described with reference to FIG. 2, the S/A and write driver block 120 includes a plurality of the registers 150-1 through 150-m, in each of which pre-fetch unit data is stored in operation S10, and the write driver circuit 140, which writes pre-fetch unit data sequentially output from the registers 150-1 through 150-m, respectively, to the memory cell array 110 in operation S20 during the write operation.

In addition, with reference to FIGS. 2, 7 and 10, the semiconductor device 100 also includes the S/A circuit 130, which senses and amplifies pre-fetch unit data sequentially output from the memory cell array 110 in operation S100 and stores the amplified data in the registers 150-1 through 150-m, respectively, in operation S110 during the read operation. The host I/F 501 interfaces signals between the host 510 and the S/A and write driver block 120. The host I/F 501 transmits the read data to the host 510 in operation S120.

Figure 8:
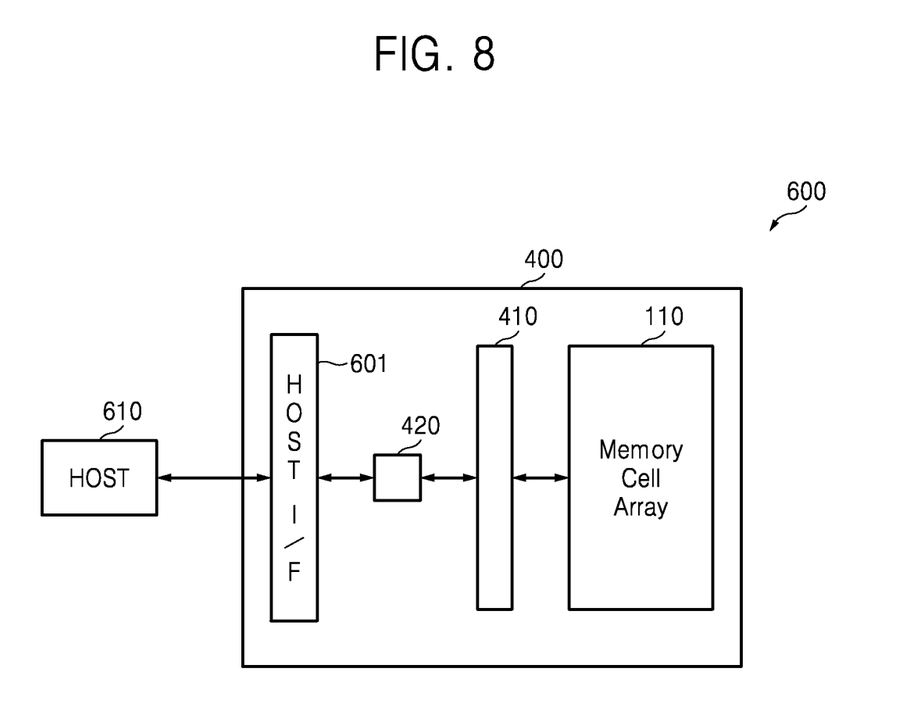
FIG. 8 is a schematic block diagram of a semiconductor system including the semiconductor device illustrated in FIG. 6.

FIG. 8 is a schematic block diagram of a semiconductor system 600 including the semiconductor device 400 illustrated in FIG. 6. Referring to FIGS. 8 through 10, the semiconductor system 600 includes the semiconductor device 400 and a processor, e.g., a host, 610 for controlling the operation of the semiconductor device 400.

The semiconductor device 400 includes the memory cell array 110 including a plurality of non-volatile memory cells, the register 420 storing write data or read data, the S/A and write driver block 410, and a host I/F 601. During the write operation, write data transmitted from the host 610 is stored in pre-fetch units in the register 420 in operation S10. A write driver circuit of the S/A and write driver block 410 sequentially reads pre-fetch unit data from the register 420 and sequentially writes the pre-fetch unit data to the memory cell array 110 in operation S20.

During the read operation, a S/A circuit of the S/A and write driver block 410 sequentially senses and amplifies read data output in pre-fetch units from the memory cell array 110 in operation S100 and sequentially stores the amplified read data in the register 420 in operation S110. After the read data is all stored in the register 420, the semiconductor device 400 transmits the read data stored in the register 420 to the host 610 through the host I/F 601 in operation S120.

According to an exemplary embodiment, the numbers of S/As and write drivers needed in a semiconductor device are reduced, thereby decreasing the size of a S/A and write driver block in the semiconductor device.

The foregoing exemplary embodiments are merely exemplary and are not to be construed as limiting the scope of the claims. Various changes in form and details will be apparent to those of ordinary skill in the art.

What is claimed is:

1. A semiconductor device comprising:
a memory cell array comprising a plurality of memory cells configured to store a plurality of pre-fetch unit data;
a plurality of registers configured to store the plurality of pre-fetch unit data;
a write driver circuit configured to write the plurality of pre-fetch unit data to the memory cell array; and
a sense amplifier circuit configured to sense and amplify the plurality of pre-fetch unit data and to store the amplified plurality of pre-fetch unit data in the plurality of registers,
wherein during a write operation the write driver circuit writes the plurality of pre-fetch unit data, which is sequentially output from the plurality of registers, to the memory cell array,
wherein during a read operation the sense amplifier circuit senses and amplifies the plurality of pre-fetch unit data, which is sequentially output from the memory cell array, and sequentially stores the amplified plurality of pre-fetch unit data in the plurality of registers, and
wherein each of the plurality of registers are used in both the read and the write operations.

2. The semiconductor device of claim 1, wherein the plurality of registers comprises a plurality of cache memory.

3. The semiconductor device of claim 1, wherein the plurality of memory cells comprise resistive memory cells.

4. The semiconductor device of claim 1, wherein the plurality of memory cells comprise phase-change memory cells.

5. A semiconductor system comprising:
a semiconductor device of claim 1; and
a processor configured to control an operation of the semiconductor device.

6. The semiconductor system of claim 5, wherein the plurality of memory cells comprise resistive memory cells.

7. The semiconductor system of claim 5, wherein the plurality of memory cells comprise phase-change memory cells.

8. The semiconductor device of claim 1, wherein at least one register of the plurality of registers is configured to receive a write enable signal; and
wherein the write driver circuit is configured to write pre-fetch unit data according to the write enable signal.

9. The semiconductor device of claim 1, wherein each register of the plurality of registers is connected between the write driver circuit and the sense amplifier circuit.

10. The semiconductor device of claim 1, wherein each register of the plurality of registers is configured to receive a write enable signal, a reset line signal and a write control signal, and
wherein each of the plurality of registers has an identical internal circuit configuration configured to receive the write enable signal, the reset line signal and the write control signal.

11. A semiconductor device comprising:
a memory cell array comprising a plurality of memory cells;
a register configured to store write data or read data;
a write driver circuit configured to sequentially read the write data in pre-fetch units from the register and sequentially write the write data to the memory cell array; and
a sense amplifier circuit configured to sequentially sense and amplify the read data in the pre-fetch units from the memory cell array and to store the amplified read data in the register,
wherein the register only stores write data during a write operation and only stores read data during a read operation.

12. The semiconductor device of claim 11, wherein the register comprises static random access memory (SRAM) and an amount of the write or read data is a multiple of one of the pre-fetch units.

13. The semiconductor device of claim 11, wherein the register comprises a cache memory.

14. The semiconductor device of claim 11, wherein the plurality of memory cells comprise resistive memory cells.

15. The semiconductor device of claim 11, wherein the plurality of memory cells comprise phase-change memory cells.

16. A semiconductor system comprising:
a semiconductor device of claim 11; and
a sense amplifier circuit configured to sequentially sense and amplify the read data in the pre-fetch units from the memory cell array and to store the amplified read data in the register.

17. The semiconductor system of claim 16, wherein the register comprises static random access memory (SRAM) and an amount of the write or read data is a multiple of one of the pre-fetch units.

18. The semiconductor system of claim 16, wherein the plurality of memory cells comprise resistive memory cells.

19. The semiconductor system of claim 16, wherein the memory cells comprise phase-change memory cells.

20. A semiconductor device comprising:
a memory array comprising a plurality of memory cells;
a plurality of registers which store a plurality of pre-fetch unit data; and
a write driver circuit which communicates with memory cells of at least two columns of the memory array or memory cells of at least two rows of the memory array and is configured to write one of the plurality of pre-fetch unit data at a time, each of the plurality of pre-fetch unit data being output from a corresponding one of the plurality of registers to the memory cell array,
wherein each of the plurality of registers are used in both the read and the write operations.

* * * * *